United States Patent [19]

McIntyre et al.

[11] 3,740,584

[45] June 19, 1973

[54] HIGH ARRANGEMENT FREQUENCY SCR GATING

[75] Inventors: James E. McIntyre, Crum Lynne; Dante E. Piccone, Philadelphia; Istvan Somos, Lansdowne, all of Pa.

[73] Assignee: General Electric Company, Philadelphia, Pa.

[22] Filed: June 8, 1971

[21] Appl. No.: 150,969

[52] U.S. Cl. ....... 307/252 G, 307/305, 317/235 AB

[51] Int. Cl. ........................ H01l 11/10, H01l 13/00

[58] Field of Search ............................ 317/235 AB; 307/252 G, 252 K, 252 M, 252 Q, 305

[56] References Cited

UNITED STATES PATENTS

| | | | |
|---|---|---|---|
| 3,275,909 | 9/1966 | Gutzwiller | 317/235 AB |
| 3,381,186 | 4/1968 | Arends | 317/235 AB |
| 3,364,440 | 1/1968 | Schreiner | 317/235 AB |
| 3,476,993 | 11/1969 | Aldrich et al. | 317/235 AB |
| 3,271,587 | 9/1966 | Schreiner | 317/235 AB |
| 3,489,962 | 1/1970 | McIntyre et al. | 317/235 AB |
| 3,486,088 | 12/1968 | Gray et al. | 317/235 AB |

FOREIGN PATENTS OR APPLICATIONS

| | | | |
|---|---|---|---|
| 1,488,195 | 4/1969 | Germany | 307/252 K |

*Primary Examiner*—John W. Huckert
*Assistant Examiner*—William D. Larkins
*Attorney*—J. Wesley Haubner, Barry A. Stein, Frank L. Neuhauser, Oscar B. Waddell and Melvin M. Goldenberg

[57] ABSTRACT

A semiconductor controlled rectifier being particularly suited for high power, high frequency applications is disclosed. The rectifier includes at least two gates which are spaced from each other. One gate is triggered with positive signals to initiate current conduction through the rectifier for one cycle of operation and the other gate is triggered with negative pulses to initiate the immediately succeeding cycle of operation.

2 Claims, 5 Drawing Figures

Patented June 19, 1973

3,740,584

INVENTORS:
JAMES E. McINTYRE,
DANTE E. PICCONE,
ISTVAN SOMOS,

BY Barry A. Stein
ATTORNEY

HIGH ARRANGEMENT FREQUENCY SCR GATING

BACKGROUND AND OBJECTS OF THE INVENTION

This invention relates generally to solid state electric current switches of the multi-layer semiconductor type and more particularly it relates to high power controlled rectifiers (known generally as thyristors or SCR's) being particularly adapted for use in high frequency switching applications.

Typically a SCR comprises a thin, broad area disk-like body or wafer having four distinct layers of semiconductor material (silicon), with contiguous layers being of different conductivity types to form three back-to-back PN (rectifying) junctions in series. A pair of main current-carrying electrodes (anode and cathode) are provided in low resistance (ohmic) contact with the outer surfaces of the respective end layers of the silicon body, and for triggering conduction between these electrodes the body is normally equipped with at least one control electrode or gate. To complete the device the silicon body is sealed in an insulating housing, and it can be externally connected to associated electric power and control circuits by means of its main and control electrodes.

When connected in series with a load impedance and a source of forward bias voltage, an SCR will ordinarily block appreciable current flow between its anode and cathode until a small current of suitable magnitude and duration is supplied to the gate whereupon it abruptly switches from a high impedance to a very low impedance, forward conducting, turned on state whereby load current conduction commences. The load current conduction invariable starts at a pin point or microplasma area closely adjacent to the gate and spreads out at a finite speed to eventually encompass substantially the full wafer area of the device. When load current flowing through the device is subsequently reduced below a certain holding level, the device begins to turn off, whereupon load current conduction therethrough ceases. A short period of time after the termination of load current (known as the turn-off time), the device regains its forward voltage blocking ability.

As is known, turn-off time is a function of the lifetime of the current carriers (i.e., the shorter the lifetime of the carriers the shorter the turn-off time). By suitably controlling its carrier lifetime, a semiconductor device with a relatively short turn-off time can be manufactured. High current density through the device also results in the reduction of carrier lifetime and the concomitant reduction of turn-off time.

During operation of a semiconductor controlled rectifier, heat is produced in its body. The amount of heat produced is a function of a number of parameters, one being the current density in the semiconductor body. As is known, semiconductor controlled rectifiers are temperature limited in that their ability to carry load current is impaired if the temperature of the semiconductor wafer is too high. Accordingly, it is desirable that the energy dissipated in a rectifier be spread out over its entire wafer area to preclude the formation of potentially damaging "hot spots." In devices which are made to switch on and off at relatively low frequencies the current has sufficient time to spread out over a substantial portion of the wafer area during the interval that the rectifier is conducting (this interval is hereinafter referred to as the "conduction interval"). In such an event enough energy is dissipated by the relatively large wafer area to enable the device to operate within prescribed safe temperature ranges.

If a device is switched on and off at high frequencies (e.g., 10,000 hertz to 30,000 hertz), due to the short conduction interval, the current will not have time to spread over as large a portion of the available wafer area as in a comparable device operated at low frequencies. Therefore when operated at high frequencies and comparable energy levels the device is prone to heat up due to the fact that all of the energy is confined to the same relatively small portion of the wafer area during every conduction interval.

It has been proposed that devices for use in high frequency power switching apparatus utilize a plurality of simultaneously triggered gates for initially turning on a large portion of the available wafer area, thereby reducing current density and avoiding overheating. Several problems accrue with this approach. First, it is hard to simultaneously trigger plural gates of a single device. Furthermore, assuming that simultaneous triggering can be accomplished, the resulting larger plasma area and lower current density would tend to increase the device's turn off time. Long turn off times are undesirable in high frequency applications of such devices.

In view of the difficulty in constructing a high frequency device which is suitable for use in high power switching apparatus, such as inverters, various approaches have been proposed to utilize state-of-the-art devices having longer than acceptable turn off times to achieve the desired output frequency. These approaches are based on a time sharing concept, wherein plural devices (each having a longer-than-acceptable turn off time) are interconnected and sequentially fired to provide the desired output frequency. U.S. Pat. No. 2,179,366-Willis shows one such approach applied to ionic tube controlled rectifiers. Needless to say time sharing approaches are expensive and complicated in that they utilize plural devices and associated circuitry to perform the function which a single device should perform.

Accordingly, it is a general object of our invention to provide a high power semiconductor controlled rectifier adapted for use in high frequency electrical equipment.

It is a further object of our invention to provide a high power, high frequency, controlled rectifier device wherein a larger portion of the available semiconductor body is utilized to conduct load current over a plurality of conduction cycles than in prior art devices.

It is yet a further object of our invention to provide a high power, high frequency controlled rectifier having good heat dissipating properties and a short turn off time.

SUMMARY OF THE INVENTION

In carrying out our invention in one form we provide a controlled rectifier device including a semiconductor body having a plurality of layers of alternate P-N type conductivity sandwiched between a pair of main load current carrying electrodes. A plurality of gates are provided for rendering the device conductive. In accordance with one embodiment of our invention, our controlled rectifier includes two gates on a layer of the semiconductor body. The gates are spaced from one another. Trigger signal producing means are coupled to the gates for supplying energy pulses thereto.

Upon receipt of an energy pulse at the first gate, load current begins flowing between the main electrodes and through a first portion of the semiconductor body closely adjacent to that gate. After a preselected period of time, during which load current conduction through the first portion had terminated, an energy pulse is provided to the second gate, whereupon load current begins flowing between the main electrodes and through a second portion of the semiconductor body closely adjacent to that gate.

The energy pulses provided to a gate can either be of positive or negative polarity or a combination of both depending upon the conductivity type of the semiconductor wafer layer at the gate.

When constructed and triggered in the above noted manner the semiconductor rectifier can be expeditiously used to perform high frequency switching functions in that it has a relatively short turn off time. Furthermore, the heat generated in its body during high frequency operation tends to spread across a large portion of that body, thereby precluding the build up of potentially destructive hot spots.

BRIEF DESCRIPTION OF THE DRAWINGS

Our invention will be better understood in its various objects and advantages will be more fully appreciated from the following description taken in conjunction with the accompanying drawings in which.

DETAILED DESCRIPTION OF THE PREFERRED EMBODIMENTS

Figures 1, 2, 3, 4, 5:
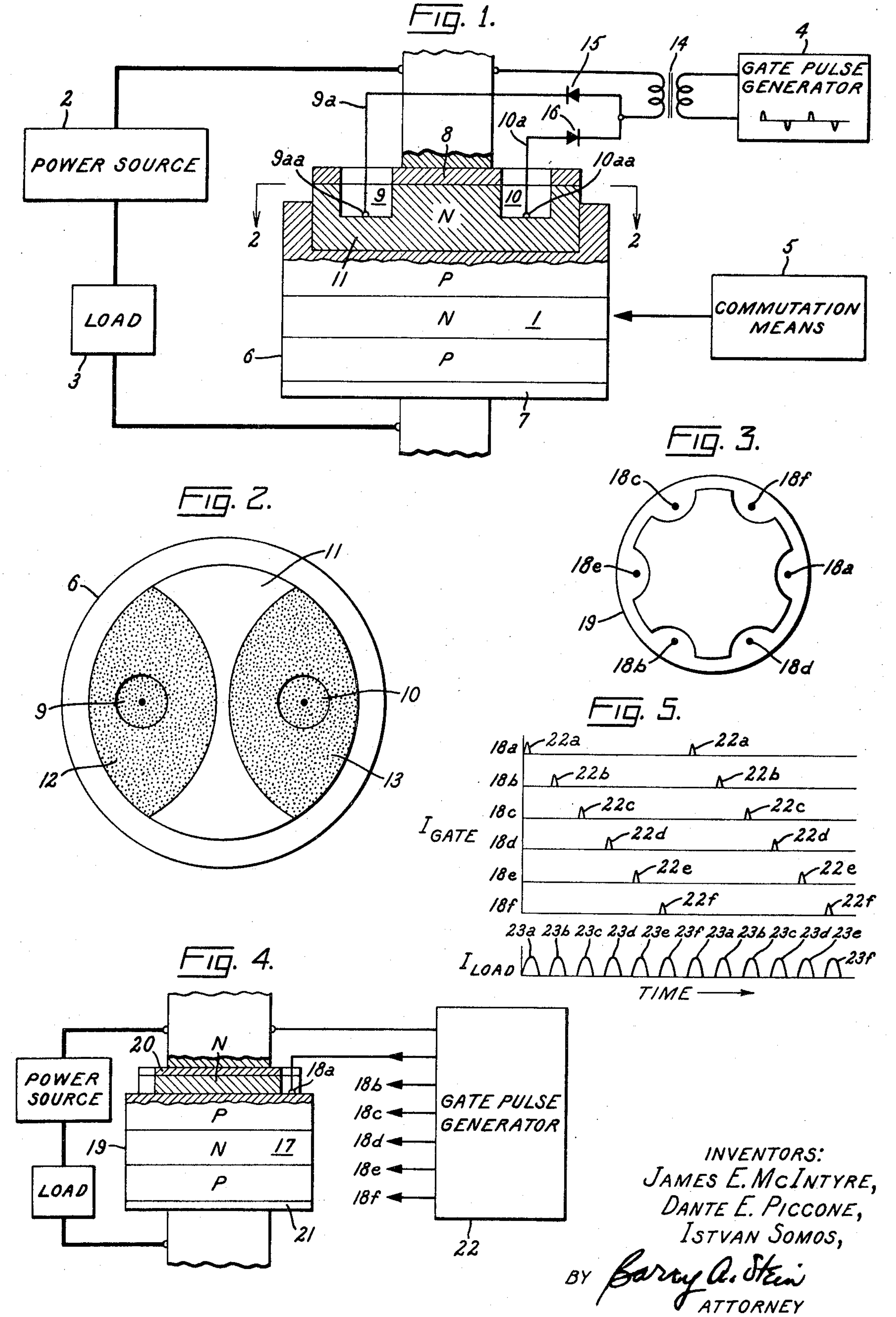
FIG. 1 is a schematic diagram of a controlled rectifier in accordance with our invention connected in a power system.
FIG. 2 is a cross sectional view of the controlled rectifier shown in FIG. 1 taken along line 2—2.
FIG. 3 is a top view of another controlled rectifier in accordance with our invention.
FIG. 4 is a schematic diagram of the control rectifier shown in FIG. 3 connected in a power system.
FIG. 5 is a graphical representation of the current pulses provided to respective gates of the rectifier shown in FIGS. 3 and 4 and the load current.

As shown in FIG. 1 a controlled rectifier 1, in accordance with our invention, is connected in the power system between a power source 2 and a load 3. The rectifier is adapted for cyclically conducting unidirectional current between the power source and the load under the control of periodic trigger signals from a gate pulse generator 4. After conducting for a preselected period of time, the rectifier is caused to switch to its nonconductive state by the operation of means in the external circuit to which it is coupled, thus terminating the flow of load current therethrough. In the interest of simplicity such means is shown in functional block diagram form in FIG. 1 and is denoted as a commutation means 5. By commutation means we mean to denote that something causes the rectifier to cease conducting. In D-C applications (i.e., where source 2 is a D-C source) the commutation means is arranged to reduce the magnitude of load current below a holding level and thus turn the rectifier off. In A-C applications (i.e., where source 2 is an A-C source) the cyclically recurring natural current zero may be used to turn the rectifier off. Accordingly, the commutation means shown functionally is merely indicative of the existence of some means (be it the power source, the load, additional circuitry, or a gate turn off mechanism) for periodically turning off the rectifier.

When the rectifier regains its blocking ability after having been commutated off, it is ready for being rendered conductive again by another trigger signal from the gate pulse generator. The rate at which the rectifier is switched from non-conducting to conducting states determines the frequency of the train of unidirectional current pulses that it conducts. Rectifier 1 is capable of successful high power switching operations at heretofore unattainable frequencies of 10 kHz. to 30 kHz. due to its unique gate arrangement and triggering sequence.

As can be seen the rectifier comprises a semiconductor body or wafer 6 composed of plural layers of alternate P and N conductivity disposed between a pair of main electrodes, namely, the anode 7 and the cathode 8. For reasons which will be considered later, the alternate conductivity layers are preferably constructed and arranged in accordance with the teachings of our U.S. Pat. No. 3,489,962, assigned to the same assignee as our present invention.

As shown in FIG. 1, rectifier 1 is provided with a pair of gates 9 and 10, which are cyclically activated to render rectifier 1 conductive. In the illustrated embodiments of our invention, each of the gates is adapted to trigger the device upon receipt of suitable triggering energy in the form of current pulses. To that end gate 9 includes a gate lead 9a which is connected to a portion of an N type semiconductor layer 11 at control point **9*aa*. In a similar manner gate 10 includes a gate lead 10*a* which is connected to a portion of layer 11 at control point 10*aa*. Each gate lead's connection to wafer 11 is made in accordance with the teachings of our above noted patent. Accordingly, rectifier 1** can be rendered conductive by the application of either positive or negative current pulses to either gate via its respective gate lead.

The control means for supplying energy pulses to the gate leads **9*a* and 10*a* of the device 1 are operative in sequence so that the respective gates are activated in a staggered time relationship to one another. Consequently the two gates of the rectifier 1 alternately trigger the rectifier, and conduction is initiated exclusively from a single gate during each operating cycle. For example, the control means causes only gate 9 to initiate current conduction through the rectifier for one conduction interval, and the next trigger signal activates only the other gate 10** to initiate load current conduction through the rectifier for the immediately succeeding conduction interval.

The advantages of this mode of operation in high frequency applications will become apparent with reference to FIG. 2.

FIG. 2 is a cross sectional view of rectifier 1 taken along 2—2 in FIG. 1 and schematically represents the conductive condition of the rectifier during two consecutive conduction intervals. For example, it should be assumed that the rectifier was heretofore in its nonconducting state and a trigger signal or pulse had just been provided to control point **9*aa* via gate lead 9*a***. In such an event a small area immediately adjacent the control point becomes conductive and the flow of load current between the anode and cathode passes therethrough. This small conductive area or microplasm spreads out at a relatively fast finite speed. Nevertheless, owing to the fact that in high frequency operation (e.g., 20 kHz) the rectifier's conductive interval is approximately 20–25 microseconds, the plasma or conductive area of the wafer will not have time to spread out and encompass the entire rectifier wafer area. By way of pictorial example, the area to which the plasma will spread from the vicinity of control point 9*aa* during one high frequency conduction interval is shown as area 12. The operating frequencies of the gate pulse generator 4 and the commutation means 5 are coordinated so that after a preselected period of time (depending upon the actual load current frequency) during which the flow of current through area 12 had terminated and the rectifier had resumed its blocking capability, a trigger pulse is provided to control point 10*aa* via gate lead 10*a*, whereupon the small wafer area immediately adjacent thereto begins conducting the load current between the anode and the cathode. This microplasm spreads out in a manner similar to that previously noted and eventually encompasses the wafer area 13 during the conduction interval.

It should be appreciated that during the two conduction intervals described the unidirectional load current traverses both areas 12 and 13. Accordingly, the heat generated during steady state operation is spread out over a relatively larger portion of the available wafer area (i.e., both areas 12 and 13) as compared to the area which would be rendered conductive if a common single control point were triggered to produce each conduction interval.

Furthermore, we have found that by sequentially triggering one gate of the rectifier to initiate one conduction interval and then the other gate of the rectifier to initiate the next conduction interval the sum of the areas rendered conductive during the two successive conduction intervals will be greater than the conductive areas produced if both gates were simultaneously triggered. This effect occurs since the current density in the rectifier each conduction cycle is higher when the device is triggered by a single gate, and as is known speed of plasma spread increases with increased current density.

Therefore, by utilizing a rectifier having plural, consecutively triggered gates, its thermal resistance is lower than a comparably sized rectifier having plural, simultaneously triggered gates.

Inasmuch as only one rectifier gate is triggered to initiate each conduction interval in accordance with our invention, the load current passing through the rectifier is confined to the conductive area closely adjacent to the gate which was triggered. Therefore, each conduction interval the load current density in the rectifier will be greater than it would be if both gates were simultaneously triggered. High current density results in decreasing the lifetime of the current carriers in the semiconductor wafer. As was previously noted a decrease in carrier lifetime results in a decrease in rectifier turn off time.

It should be appreciated that any number of means can be used to produce and to supply the periodic triggering energy to the plural rectifier control points (e.g., light energy may be supplied directly on light sensitized rectifier control points). As shown, we prefer to utilize a gate pulse generator which produces electrical energy pulses which alternate in polarity and which are supplied to the control points via circuit means. In that regard positive current pulses produced by a gate pulse generator 4 are coupled through a transformer 14, a diode 15 and gate lead 9*a* to control point 9*aa* of rectifier 1. In a similar manner the negative current pulses produced by the generator are coupled through the transformer, a diode 16 and gate lead 10 to control point 10*a*.

FIG. 4 is a schematic diagram of a rectifier 17 which is particularly adapted for operation at the upper end of the 10 kh. to 30 kh. frequency range. The rectifier includes a semiconductor wafer having four layers of alternate P-N type conductivity and has six gates namely 18*a*, 18*b*, 18*c*, 18*d*, 18*e* and 18*f* which are connected to a layer 19 of P type conductivity. The position of the six gates on layer 19 can be seen clearly in the top view of the rectifier 17 shown in FIG. 3.

As in rectifier 1, the four layer semiconductor wafer of rectifier 17 is disposed between a main cathode electrode 20 and a main anode electrode 21.

Energy pulses for triggering the rectifier into conduction are provided by a gate pulse generator 22. This generator provides sequential positive current pulses to the respective gates of rectifier 17 in a predetermined order to effectuate turn-on of the rectifier.

The current pulses which are supplied by the pulse train generator to the respective rectifier gates are shown in FIG. 5. The sequential operation of the generator is as follows: A trigger signal 22*a* is produced by generator 22 and provided to the gate 18*a* of the rectifier 17 whereupon the rectifier begins conducting load current through a portion of its semiconductor wafer closely adjacent to the gate connection point. After a preselected period of time commutation means (not shown) causes the rectifier to turn off and regain its blocking state. The load current passing through the rectifier during this first conduction interval is shown in FIG. 5 as a current pulse 23*a*. A preselected period of time after the termination of trigger signal 22*a* a gate pulse generator produces a trigger signal 22*b*, which is provided to gate 18*b* thereby initiating a second cycle of conduction and enabling current to resume flowing in the same direction between the main electrodes of the rectifier. This load current pulse 23b passes through the portion of the semiconductor wafer closely adjacent to the gate 18*b*. A preselected period of time after the termination of trigger signal 22*b*, the gate pulse generator produces a trigger signal 22*c* which is provided to gate 18*c* thereby initiating a third conduction interval during which a load current pulse 23*c* passes through the portion of the semiconductor wafer closely adjacent to that gate connection point. In a continuously consecutive manner, the fourth cycle of load current 23*d* begins in the vicinity of gate 18*d* when the next trigger signal 22*d* is supplied thereto, subsequently the provision of trigger signal 22*e* to gate 18*e* produces a load current pulse 23*e*, and a provision of trigger signal 22*f* to gate 18*f* produces a load current pulse 23*f*. A preselected period of time after the termination of trigger signal 22*f* the gate pulse generator produces trigger signal 22*a* and the above described sequence is repeated.

The advantage of using more than two gates for operation in the upper portion of the 10 kH. to 30 kH. frequency range is that over a plurality of conduction intervals a large portion of the available semiconductor wafer is utilized. This reduces the possibility of rectifier overheating. Furthermore, since the conduction intervals are very short, current density through the semiconductor wafer portion which is rendered conductive in a particular conduction interval is relatively high thereby speeding up the plasma spread during the interval as well as enabling the rectifier to regain its blocking state quickly. It will also be noted that while the train of load current pulses has a predetermined high frequency, each of the individual gates is supplied with a trigger signal at a frequency which is only a fraction (one-sixth in the illustrated embodiment) of that high frequency.

As can be seen in FIG. 3 the six gates are not sequentially disposed about the surface of layer 19. Rather they are disposed in an alternating arrangement which, reading in a clockwise direction, finds gate 18*d* next to gate 18*a*, gate 18*b* next to gate 18*d*, gate 18*e* next to gate 18*b*, gate 18*c* next to gate 18*e*, gate 18*f* next to gate 18*c* and gate 18*a* next to gate 18*f*. When the gates are disposed in this manner and are triggered in the sequence shown in FIG. 5, the possibility of overheating is minimized since consecutively conductive semiconductor wafer areas are separated from one another by a wafer area which does not become conductive until a future time. For example, the heat which builds up in the conductive area closely adjacent to the gate 18*a* during the first conduction interval will have minimal effect on rectifier's operation during the second conduction interval since load current conduction during that interval is through the wafer area closely adjacent to the gate 18*b* which is spaced from gate 18*a* by the wafer area adjacent to the gate 18*d*.

While we have shown and described a particular embodiment of our invention, it will be obvious to those skilled in the art that various changes and modifications may be made without departing from our invention in its broader aspects; and we, therefore, intend herein to cover all such changes and modifications as fall within the true spirit and scope of our invention.

What I claim as new and desire to secure by Letters Patent of the United States is:

1. In a high power, high frequency semiconductor switching device adapted for connection between a voltage source and a load:

a. an asymmetrically conductive semiconductor body having four layers of semiconductor material arranged in succession with contiguous layers being of different conductivity types;

b. a pair of spaced-apart main load current carrying electrodes respectively connected to opposite end layers of said body;

c. a first control point on one of said body layers for receiving triggering energy;

d. a second control point on one of said body layers for receiving triggering energy, said second point being spaced from said first point;

e. first periodically operative means coupled between one of said main electrodes and said first control point for supplying to said first control point relatively positive voltage pulses each of which is effective to initiate the flow of load current in one direction between said main electrodes through a first portion of said semiconductor body closely adjacent to said first control point, said current flow terminating after a preselected period of time; and f. second means coupled between said one of said main electrodes and said second control point and operative only after load current conduction through said first portion has terminated to supply to said second point relatively negative voltage pulses that enable load current to resume flowing in said one direction between said main electrodes through a second portion of said semiconductor body closely adjacent to said second control point, said second means being operative in repetitive sequence with the operation of said first means.

2. The high frequency semiconductor device as specified in claim 1, wherein said first and second control points are both on a common one of said end layers of said body, said one of said end layers being of N-type conductivity.

* * * * *

PO-1050
(5/69)

UNITED STATES PATENT OFFICE

CERTIFICATE OF CORRECTION

Patent No. 3,740,584 Dated June 19, 1973

Inventor(s) JE McIntyre, DE Piccone and I Somos

It is certified that error appears in the above-identified patent and that said Letters Patent are hereby corrected as shown below:

Change the title to:

"High Frequency SCR Gating Arrangement"

Signed and sealed this 2nd day of July 1974

(SEAL)
Attest:

EDWARD M. FLETCHER, JR.
Attesting Officer

C. MARSHALL DANN
Commissioner of Patents